(12) United States Patent
Machida

(10) Patent No.: US 9,857,408 B2
(45) Date of Patent: Jan. 2, 2018

(54) INSULATION MONITORING DEVICE

(71) Applicant: FUJI ELECTRIC FA COMPONENTS & SYSTEMS CO., LTD., Tokyo (JP)

(72) Inventor: Satoshi Machida, Gunma (JP)

(73) Assignee: FUJI ELECTRIC FA COMPONENTS & SYSTEMS CO., LTD., Tokyo (JP)

( * ) Notice: Subject to any disclaimer, the term of this patent is extended or adjusted under 35 U.S.C. 154(b) by 0 days.

(21) Appl. No.: 14/791,991

(22) Filed: Jul. 6, 2015

(65) Prior Publication Data

US 2015/0309106 A1 Oct. 29, 2015

Related U.S. Application Data

(63) Continuation of application No. PCT/JP2013/067478, filed on Jun. 26, 2013.

(51) Int. Cl.
G01R 31/02 (2006.01)
H02H 1/00 (2006.01)
G01R 27/18 (2006.01)

(52) U.S. Cl.
CPC .......... G01R 31/025 (2013.01); G01R 27/18 (2013.01); H02H 1/003 (2013.01)

(58) Field of Classification Search
CPC ....... G01R 31/025; G01R 27/18; H02H 1/003
(Continued)

(56) References Cited

U.S. PATENT DOCUMENTS 5,066,920 A 11/1991 Suptitz
5,272,440 A 12/1993 Weynachter et al.
(Continued)

FOREIGN PATENT DOCUMENTS

CN 202309245 7/2012
EP 1 919 193 A2 5/2008
(Continued)

OTHER PUBLICATIONS

International Search Report mailed Oct. 1, 2013, in corresponding International Application No. PCT/JP2013/067478.
(Continued)

*Primary Examiner* — Christopher Mahoney

(57) ABSTRACT

An insulation monitoring device that carries out insulation monitoring of a power system or load apparatus using, for example, an Igr method includes a table in which a monitoring setting value Irref greater than a resistance component error current flowing in accordance with the sum of the electrical capacitance of a capacitor configuring a noise filter on the input side of the load apparatus and the ground insulation capacitance of the power system is set in advance in accordance with an operating schedule of the load apparatus, a monitoring setting value computing unit that outputs the monitoring setting value $I_{rref}$ read from the table in accordance with a current time according to a clock, and an insulation evaluation unit that detects an insulation failure caused by a decrease in ground insulation resistance when a resistance component current extracted by an $I_{gr}$ extraction unit exceeds the monitoring setting value $I_{rref}$.

5 Claims, 15 Drawing Sheets

(58) Field of Classification Search
USPC .......................................................... 324/509
See application file for complete search history.

(56) References Cited

U.S. PATENT DOCUMENTS

| | | | |
|---|---|---|---|
| 7,110,895 | B2 | 9/2006 | Takakamo et al. |
| 8,069,000 | B2 | 11/2011 | Kim et al. |
| 2003/0112015 | A1 | 6/2003 | Takakamo et al. |
| 2005/0225909 | A1 | 10/2005 | Yoshizaki et al. |
| 2008/0309351 | A1 | 12/2008 | Stewart et al. |
| 2010/0131215 | A1 | 5/2010 | Kim |
| 2010/0161259 | A1 | 6/2010 | Kim et al. |
| 2013/0063842 | A1* | 3/2013 | Kataoka ............... G01R 31/025 361/42 |

FOREIGN PATENT DOCUMENTS

| | | |
|---|---|---|
| JP | 9-33581 | 2/1997 |
| JP | 2004-198304 | 7/2004 |
| JP | 2005-304148 | 10/2005 |
| JP | 2011-61991 | 3/2011 |
| JP | 4738274 | 5/2011 |
| TW | 1221914 | 10/2004 |
| TW | 200912329 | 3/2009 |

OTHER PUBLICATIONS

European Search Report dated Jan. 17, 2017, issued in corresponding European Patent Application 13887906.9.
Taiwanese Office Action dated May 19, 2017 in corresponding Taiwanese Patent Application No. 103116840.
Supplementary European Search Report dated Jul. 14, 2017 in corresponding European Patent Application No. 13 88 7906.9.
Anonymous: "Capacitor—Wikipedia, the free encyclopedia", Dec. 24, 2010, XP055231648, Retrieved from Internet: URL:https://en.wikipedia.org/w/index.php?title=Capacitor&oldid=403955507.

* cited by examiner

FIG.12

| MAKER | MODEL | TEMPERATURE [°C] | ELECTRICAL CAPACITANCE RATE OF CHANGE [%] |
|---|---|---|---|
| AA | B1 | −50 | −10 |
| | | −40 | −8 |
| | | −30 | −6 |
| | | ..... | ..... |
| | | 100 | 2 |
| | | 110 | 4 |
| | | 120 | 6 |
| | B2 | −50 | −5 |
| | | −40 | −4 |
| | | −30 | −3 |
| | | 120 | 3 |
| XX | Y3 | −50 | −20 |
| | | −40 | −18 |
| | | −30 | −16 |
| | | ..... | ..... |
| | | 100 | 12 |
| | | 110 | 16 |
| | | 120 | 20 |

INSULATION MONITORING DEVICE

CROSS-REFERENCE TO RELATED APPLICATIONS

This application is based on, and claims priority to, International Application No. PCT/JP2013/067478, filed on Jun. 26, 2013, the content of which is incorporated herein by reference in its entirety.

BACKGROUND

1. Field

The present disclosure relates to an insulation monitoring device that monitors the insulation state of a power system or a load apparatus connected to the power system (hereafter, this will also be referred to collectively as a power system).

2. Description of Related Art

So-called $I_{gr}$ type and $I_{or}$ type are known as insulation monitoring methods for monitoring the insulation state of a power system, as described in Japanese Patent No. 4,738,274 (e.g., paragraphs [0005] to [0011], FIG. 13, and FIG. 14).

Of these, the $I_{gr}$ type is such that a supervisory signal of a predetermined frequency differing from the system frequency is implanted in the grounding wire of a power receiving transformer, the supervisory signal, which has flowed back via a ground electrical capacitor or ground insulation resistor, is extracted from the system wiring, and the insulation state of the power system is monitored by the size of a resistance component current included in the extracted supervisory signal being compared with a predetermined monitoring setting value.

Also, the $I_{or}$ type is such that, rather than a supervisory signal being implanted in the power system, a resistance component current of the same phase as the voltage to ground of the system is extracted from a zero-phase current flowing through the grounding wire of a power receiving transformer, and the insulation state of the power system is monitored by the size of the resistance component current being compared with a predetermined monitoring setting value.

Meanwhile, it is known that when the load apparatus is a large capacity inverter or the like, a noise filter including at least a capacitor is connected to the input side of the load apparatus.

FIG. 13 shows the whole configuration of an $I_{gr}$ type insulation monitoring device applied to a power system including this kind of load apparatus and noise filter.

In FIG. 13, 10 is a power receiving transformer, 11 is a grounding wire connected to the secondary side thereof, 20 is wiring, 21 is a circuit breaker provided in the wiring 20, 22 is a ground electrical capacitor, 23 is a ground insulation resistor, 30 is a load apparatus such as a large capacity inverter, 31 is a noise filter (capacitive filter) having a capacitor, 41 is a supervisory signal superimposing unit for superimposing a supervisory signal on the grounding wire, 42 is a monitoring device main body that carries out insulation monitoring by extracting a resistance component current of the same phase as a reference voltage, to be described hereafter, from leakage current flowing through the grounding wire 11, carries out alarm output, and the like, and 43 is a reference voltage measurement unit that measures the voltage of the grounding wire 11 as the reference voltage.

Next, FIG. 14 is a block diagram showing the basic configuration of the monitoring device main body 42.

The monitoring device main body 42 is such that a frequency component the same as the supervisory signal is extracted from a reference voltage $V_{st}$ and leakage current $I_O$ by frequency extraction units 42a and 42b, and a resistance component current $I_{gr}$ of the same phase as the reference voltage $V_{st}$ is extracted by an $I_{gr}$ extraction unit 42c. Further, an insulation evaluation unit 42d compares the size of the resistance component current $I_{gr}$ with a predetermined monitoring setting value $I_{rref}$, determines that there is an insulation failure when $I_{gr}$ exceeds the monitoring setting value $I_{rref}$, and sends a signal to an alarm output unit 42e, thus causing an appropriate alarm to be output by a visual display or signal transmission to the exterior.

SUMMARY

However, the configuration illustrated in FIG. 13 is such that on the circuit breaker 21 being engaged when operating the load apparatus 30, the noise filter 31 is connected between the wiring 20 and a contact point, and the noise filter 31 has an electrical capacitance value far greater than that of the ground electrical capacitor 22.

Herein, the phase of the current flowing through the capacitance component of the noise filter 31 should ideally be in a phase leaded by 90 degrees with respect to the reference voltage $V_{st}$. Actually, however, due to the effect of the equivalent series resistance and equivalent series inductance of each capacitor configuring the noise filter 31, the phase of the current flowing through the capacitance components (the noise filter 31 and ground electrical capacitor 22) of the system is less than 90 degrees with respect to the reference voltage $V_{st}$, and includes a resistance component error current $I_{gr}'$ of the same phase as the reference voltage $V_{st}$, as shown in FIG. 15. Also, as the electrical capacitance of the capacitor has temperature characteristics, the size of the capacitance component current (actual) in FIG. 15 changes in accordance with temperature, together with which the size of the resistance component error current $I_{gr}'$ also changes.

Because of this, the monitoring device main body 42 is such that, even when the insulation of the wiring 20 is maintained, the resistance component error current $I_{gr}'$ shown in FIG. 15 is detected, as a result of which there is concern of misidentification as an insulation failure of the wiring 20.

For example, when the voltage of the wiring 20 is 50 [Hz], 200 [V], the capacitance value of the noise filter 31 is 20 [µF], and there is equivalent series resistance such that the phase of the capacitance component current (actual) wherein the ground electrical capacitor 22 is added is 87 degrees with respect to the reference voltage $V_{st}$, resistance component error current $I_{gr}'$ equivalent to 17.44 [mA], which corresponds to a phase deviation of 3 degrees, is detected by the monitoring device main body 42. In particular, in a system in which a large number of apparatus such as noise filters exist, the resistance component error current $I_{gr}'$ is added for each of the apparatus, becoming a large value.

The private electrical facilities safety management regulation JEAC8021-2006 has 50 [mA] as an upper monitoring limit but, as previously described, the size of the resistance component current differs as a result of the engaging and disengaging of the noise filter 31, and furthermore, the ambient temperature, because of which, when the monitoring setting value compared with the resistance component current is stipulated uniformly and fixedly, there is a problem in that it may happen that the monitoring level is exceeded even when there is no insulation degradation in the electrical circuit and apparatus, and it is not possible to carry out highly accurate insulation monitoring.

Therefore, an aspect of the invention is to provide an insulation monitoring device such that highly accurate insulation monitoring is possible by an appropriate monitoring setting value in accordance with load apparatus operating status and ambient temperature being automatically selected or computed.

In order to address the heretofore described problem, the disclosure relates to an insulation monitoring device that detects leakage current flowing back via a ground insulation resistor of a power system or load apparatus connected to the power system, calculates from the leakage current a resistance component current of the same phase as a reference voltage superimposed on the power system, and detects an insulation failure caused by a decrease in the ground insulation resistance when the resistance component current exceeds a monitoring setting value, wherein the insulation monitoring device has as an object a power system to which a noise filter including a capacitor is connected when the load apparatus operates.

Further, a first aspect of the invention includes a table in which a monitoring setting value, calculated by a resistance component error current (setting value) caused by the electrical capacitance component current of the capacitor being added to a monitoring base setting value (for example, the upper monitoring limit of 50 [mA] stipulated by the private electrical facilities safety management regulations) for monitoring the insulation of the power system and apparatus, is set in advance in accordance with an operating schedule of the load apparatus, and a monitoring setting value computing unit that outputs the monitoring setting value read from the table in accordance with the operating schedule at the current time, and uses the monitoring setting value output from the monitoring setting value computing unit in a comparison with the resistance component current, thus carrying out insulation monitoring.

A second aspect of the invention includes an operated quantity acquisition unit that acquires the operated quantity of the load apparatus, and a monitoring setting value computing unit that computes the monitoring setting value by adding a unit setting value of one load apparatus and a resistance component error current setting value caused by the electrical capacitance component current, which increases or decreases in accordance with the operated quantity, to a monitoring base setting value (for example, the upper monitoring limit of 50 [mA] stipulated by the private electrical facilities safety management regulations) for monitoring the insulation of the power system and apparatus.

A third aspect of the invention includes a resistance component current extraction unit that extracts from a current with the same frequency component as a supervisory signal a resistance component whose phase is the same as that of the supervisory signal, a capacitance component current extraction unit that extracts a capacitance component current, for example, whose phase leads by 90 degrees than that of the supervisory signal, and a monitoring setting value computing unit that computes a unit resistance component error current of a unit capacitance component current or unit electrical capacitance in accordance with the capacitance component current extracted by the capacitance component current extraction unit, and computes the monitoring setting value by adding the computed value to a monitoring base setting value (for example, the upper monitoring limit of 50 [mA] stipulated by the private electrical facilities safety management regulations) for monitoring the power system and apparatus, and uses the monitoring setting value computed by the monitoring setting value computing unit in a comparison with the resistance component current, thus carrying out insulation monitoring.

A fourth aspect of the invention includes a capacitance component current extraction unit that extracts a capacitance component current, for example, whose phase leads by 90 degrees than that of a supervisory signal, an electrical capacitance conversion unit that converts the capacitance component current extracted by the capacitance component current extraction unit into electrical capacitance, a temperature correction computing unit that corrects the electrical capacitance converted by the electrical capacitance conversion unit using an electrical capacitance rate of change in accordance with the type of capacitor used in the noise filter and an ambient temperature measurement value, and a monitoring setting value computing unit that computes the monitoring setting value by adding a resistance component error current, caused by a capacitance component current flowing in accordance with the electrical capacitance corrected by the temperature correction computing unit, to a monitoring base setting value (for example, the upper monitoring limit of 50 [mA] stipulated by the private electrical facilities safety management regulations) for monitoring the insulation of the power system and apparatus.

According to embodiments of the invention, it is possible to carry out insulation monitoring using an appropriate monitoring setting value under various conditions by the monitoring setting value being automatically selected or computed in accordance with the operating schedule or operated quantity of load apparatus having a noise filter, and furthermore, in accordance with capacitance component current or electrical capacitance extracted from the system.

BRIEF DESCRIPTION OF THE DRAWINGS

These and/or other aspects and advantages will become apparent and more readily appreciated from the following description of the embodiments, taken in conjunction with the accompanying drawings of which:

FIG. 12 is a table showing the relationship between type of capacitor and electrical capacitance rate of change.

DESCRIPTION OF EMBODIMENTS

Figure 13:
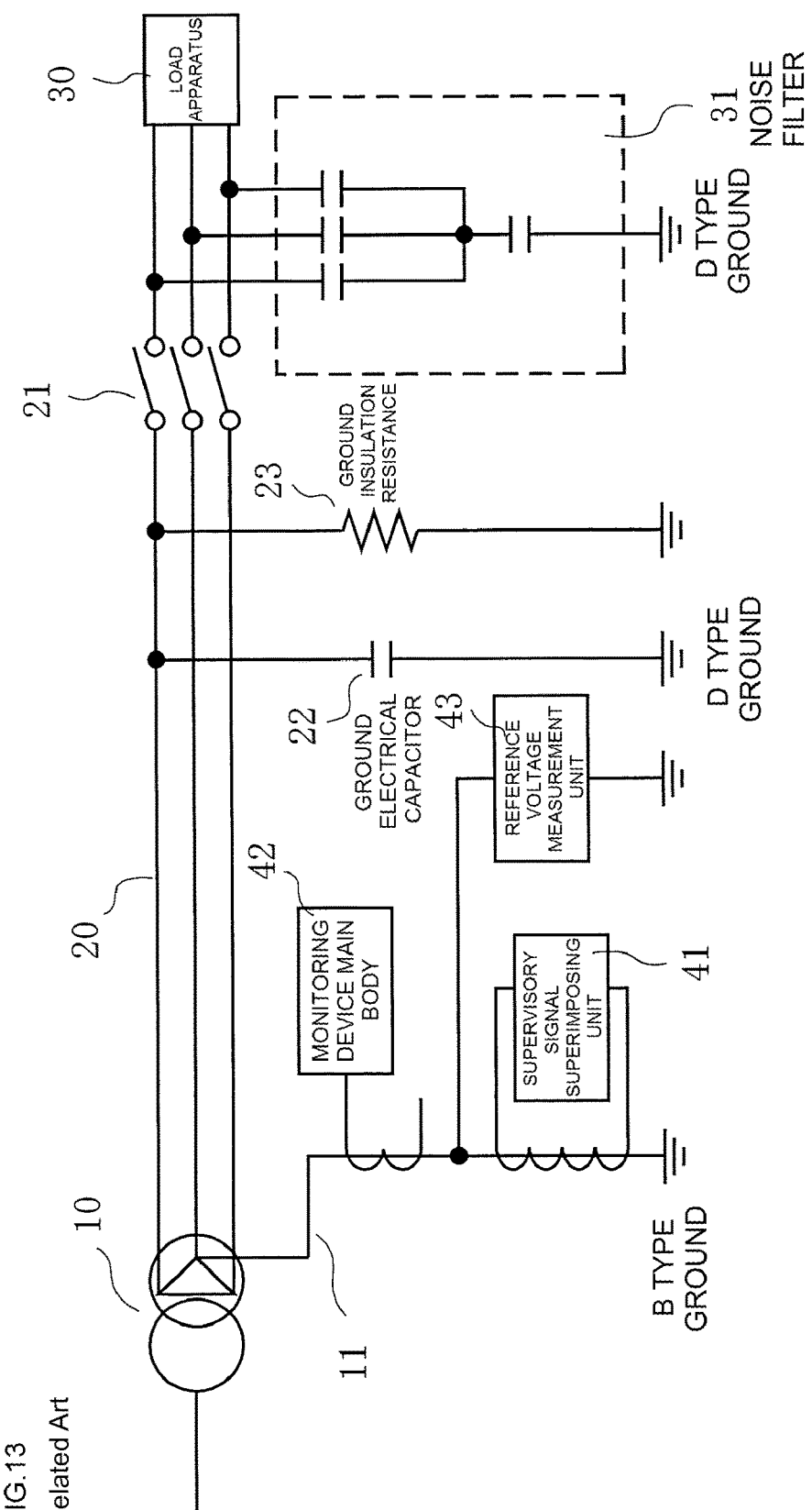
FIG. 13 is a block diagram showing the whole configuration of an existing insulation monitoring device.
Figure 14:
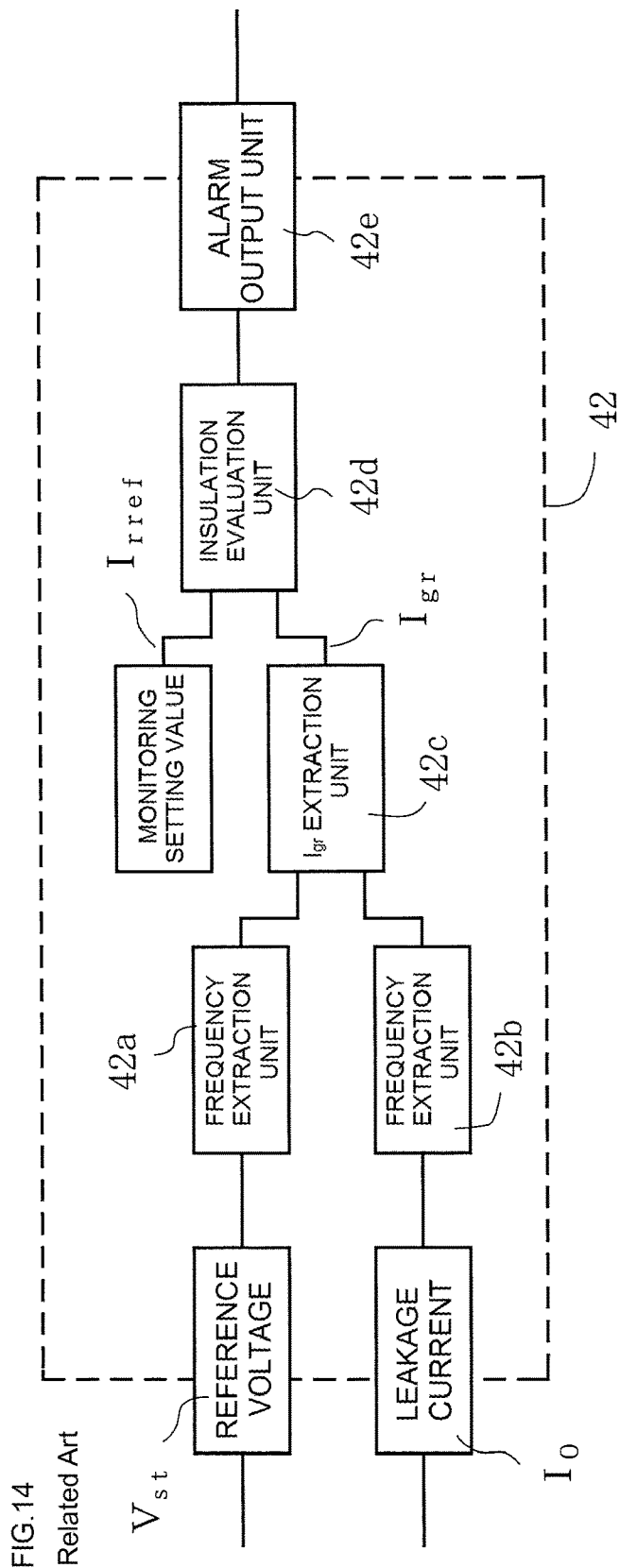
FIG. 14 is a block diagram showing the basic configuration of a monitoring device main body in FIG. 13.

Hereafter, based on the drawings, a description will be given of embodiments of the invention. The following embodiments are embodiments in a case wherein aspects of the invention are applied to the kind of $I_{gr}$ type of insulation monitoring device shown in FIG. 13.

Figure 1A:
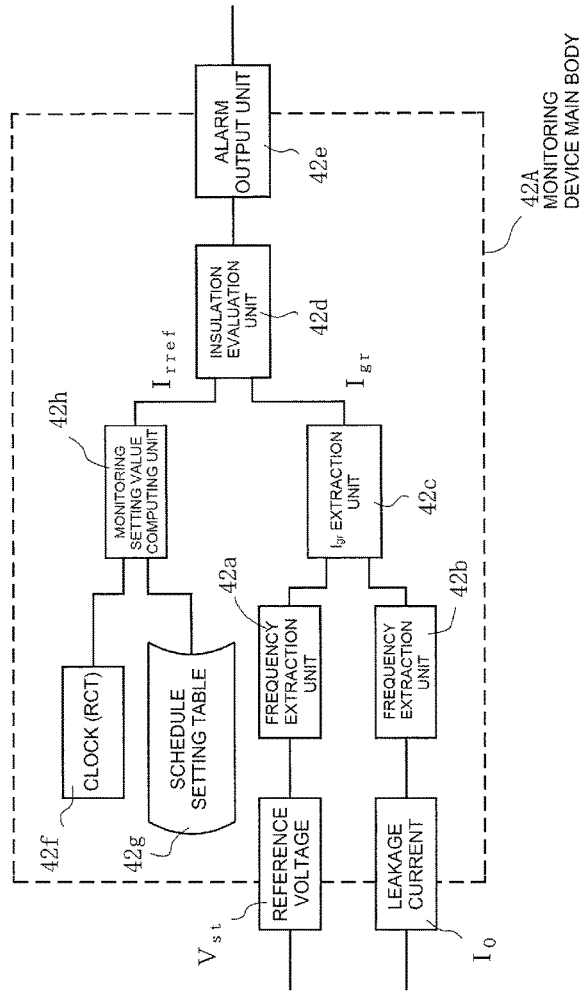
FIG. 1A is a block diagram showing the configuration of a monitoring device main body according to a first embodiment of the invention.

Firstly, FIG. 1A is a block diagram showing the configuration of a monitoring device main body according to a first embodiment of the invention. A monitoring device main body 42A of FIG. 1A is such that, in the same way as in FIG. 13, a frequency component the same as a supervisory signal is extracted from the reference voltage $V_{st}$ and leakage current $I_O$ by the frequency extraction units 42a and 42b. In the $I_{gr}$ extraction unit 42c, resistance component current $I_{gr}$ of the same phase as the reference voltage $V_{st}$ is extracted from the output of the frequency extraction unit 42b.

Figure 1B:
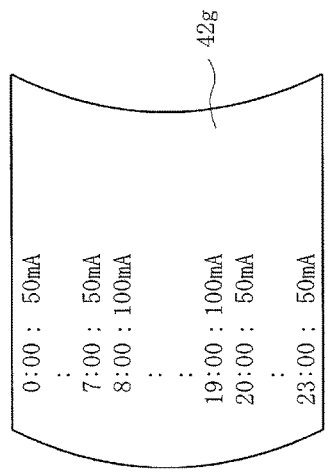
FIG. 1B is an illustration of a schedule setting table.
Figure 15:
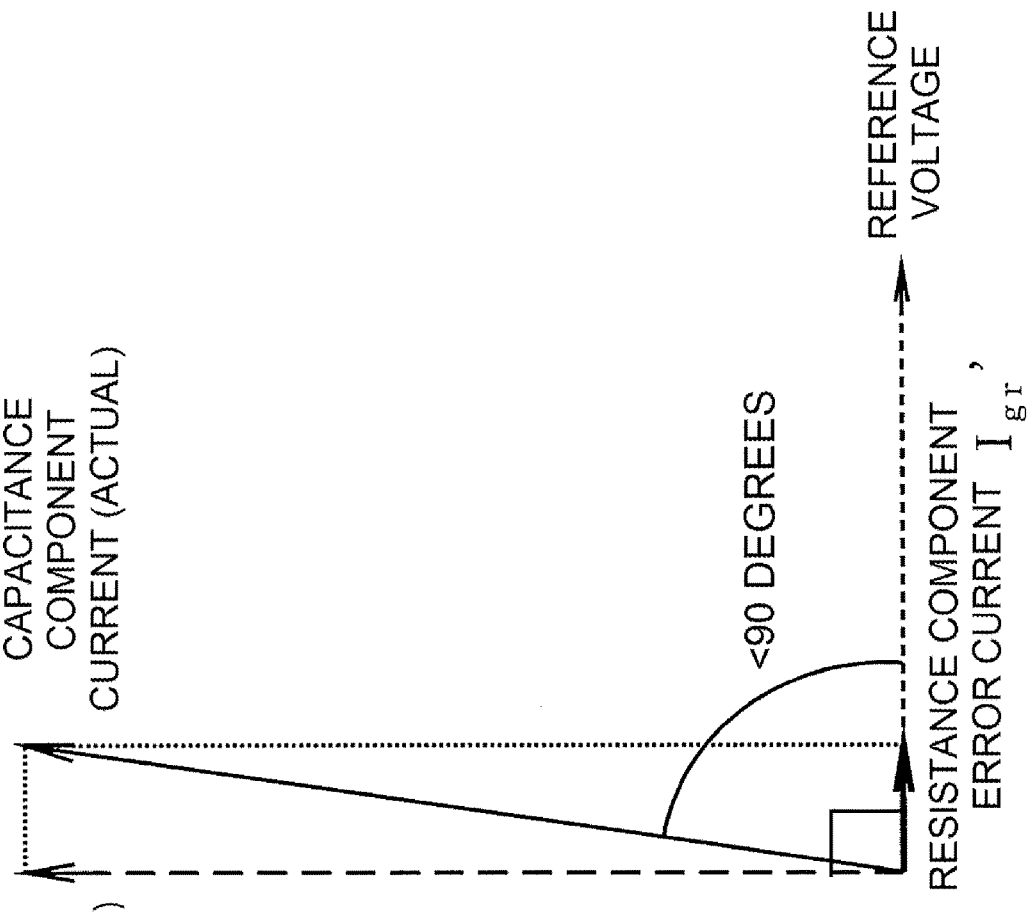
FIG. 15 is a vector diagram for illustrating a resistance component error current.

Meanwhile, monitoring setting values $I_{rref}$ in accordance with a temporal operating schedule (including at least operating time, and also including the quantity operated as necessary) of load apparatus of a system to be monitored are stored in a schedule setting table 42g, as shown in FIG. 1B. That is, when operating an inverter or the like during a one day time span 0:00 to 24:00, a noise filter is connected to the input side of the inverter, and a capacitance component current (actual) having a phase of less than 90 degrees with respect to the reference voltage flows, as shown in FIG. 15. Because of this, the resistance component error current $I_{gr}'$ is generated in accordance with the capacitance component current (actual) and, when the monitoring setting value $I_{rref}$ is fixed, the resistance component error current $I_{gr}'$ exceeds the monitoring setting value $I_{rref}$, and there is concern of misidentification as an insulation failure.

Therefore, in this embodiment, to what extent the capacitance component current (actual), and by extension the resistance component error current $I_{gr}'$, will be generated is detected in advance in accordance with the load apparatus operating schedule, and a monitoring setting value $I_{rref}$ sufficiently greater than the resistance component error current $I_{gr}'$ is set for each time span as the schedule setting table 42g.

Figure 2:
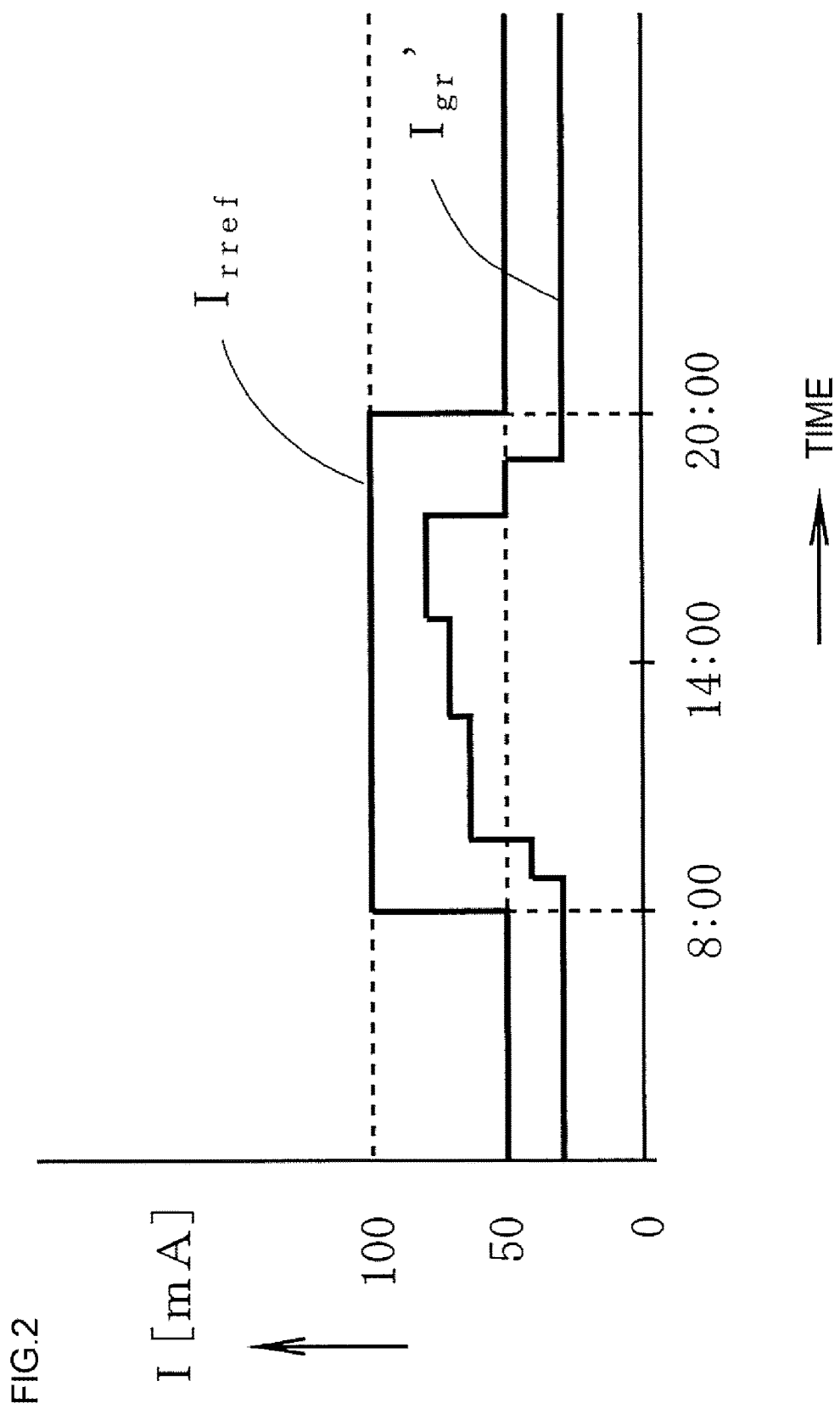
FIG. 2 is a diagram showing the relationship between a resistance component error current $I_{gr}'$ and monitoring setting value $I_{rref}$ according to time span in the first embodiment.

FIG. 2 is a diagram showing the relationship between the resistance component error current $I_{gr}'$ and monitoring setting value $I_{rref}$ according to time span, and is an example wherein the monitoring setting value $I_{rref}$ between 8:00 and 20:00 is set to be greater than that in other time spans. Also, the reason the resistance component current (error) $I_{gr}'$ varies between 8:00 and 20:00 is that the capacitance component current (actual) flowing through the noise filter varies in accordance with the operating state of the inverter and the quantity of inverters operated.

Further, referring to a clock 42f and the schedule setting table 42g, the monitoring setting value $I_{rref}$ corresponding to the current time is calculated in a monitoring setting value computing unit 42h of FIG. 1A, and sent to an insulation evaluation unit 42d.

In the insulation evaluation unit 42d, normal insulation monitoring is carried out by determining whether or not the resistance component current $I_{gr}$ output from the $I_{gr}$ extraction unit 42c has exceeded the monitoring setting value $I_{rref}$ sent from the monitoring setting value computing unit 42h. When the resistance component current $I_{gr}$ exceeds the monitoring setting value $I_{rref}$, an appropriate alarm is issued by causing the alarm output unit 42e to operate, in the same way as that heretofore known.

As heretofore described, according to the first embodiment, it is possible to use the appropriate monitoring setting value $I_{rref}$ in accordance with the load apparatus operating schedule, because of which it is possible to carry out accurate insulation monitoring throughout the day.

Figure 3:
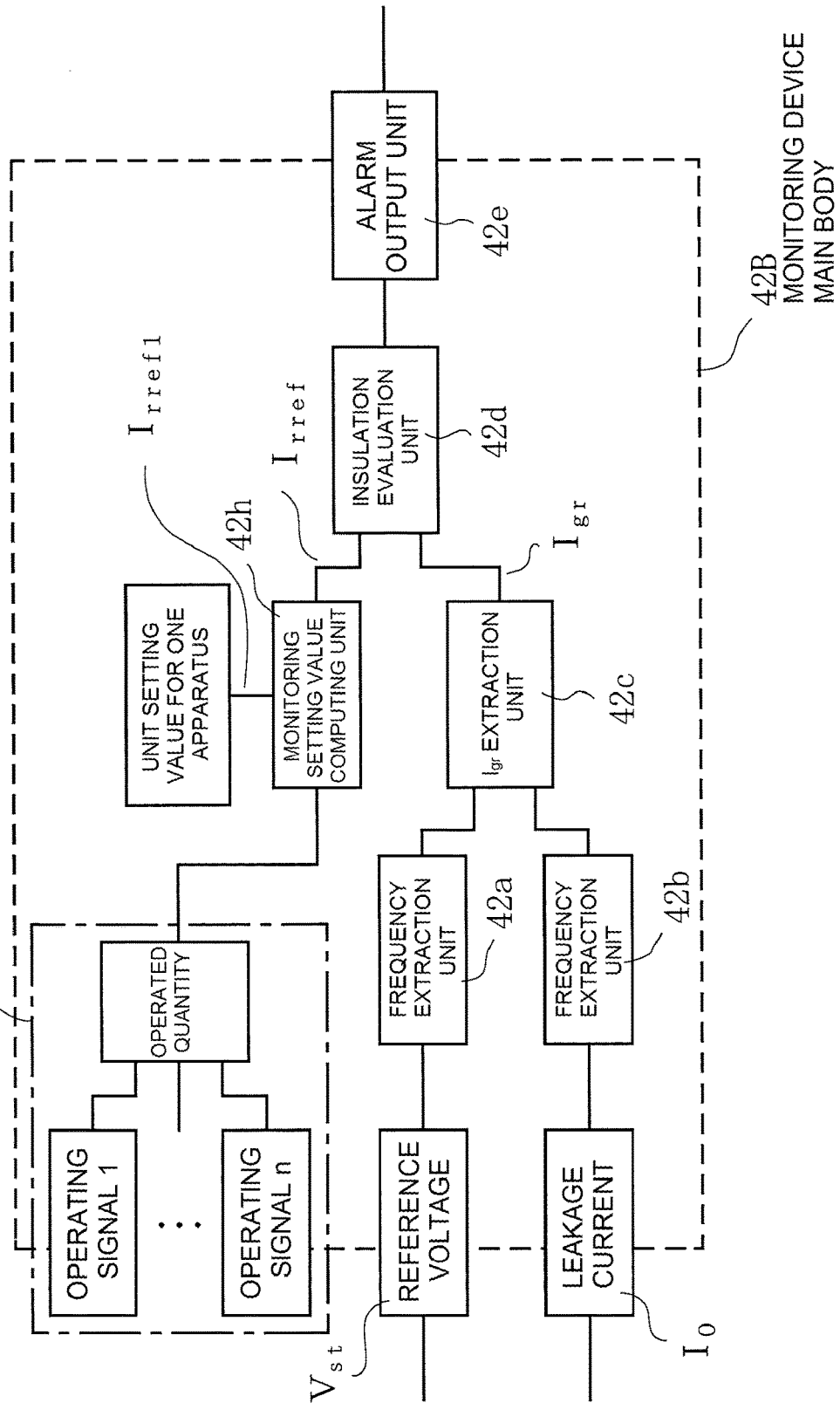
FIG. 3 is a block diagram showing the configuration of a monitoring device main body according to a second embodiment of the invention.

Next, FIG. 3 is a block diagram showing the configuration of a monitoring device main body according to a second embodiment of the invention. A monitoring device main body 42B of FIG. 3 is such that an operated quantity acquisition unit 42i takes in operating signals 1 to n of a quantity n (n is a positive integer of 1 or more) of the load apparatus to which a noise filter is connected when operating as, for example, a Di (digital input) signal, or analog signal of a predetermined level, generated when each apparatus is operating, thereby acquiring the quantity of the load apparatus operated. Also, a monitoring setting value (unit setting value) $I_{rref1}$ is set for each load apparatus in the monitoring device main body 42B. Herein, the unit setting value $I_{rref1}$ is a value corresponding to a resistance component error current caused by one load apparatus to which a noise filter is connected when operating.

Figure 4:
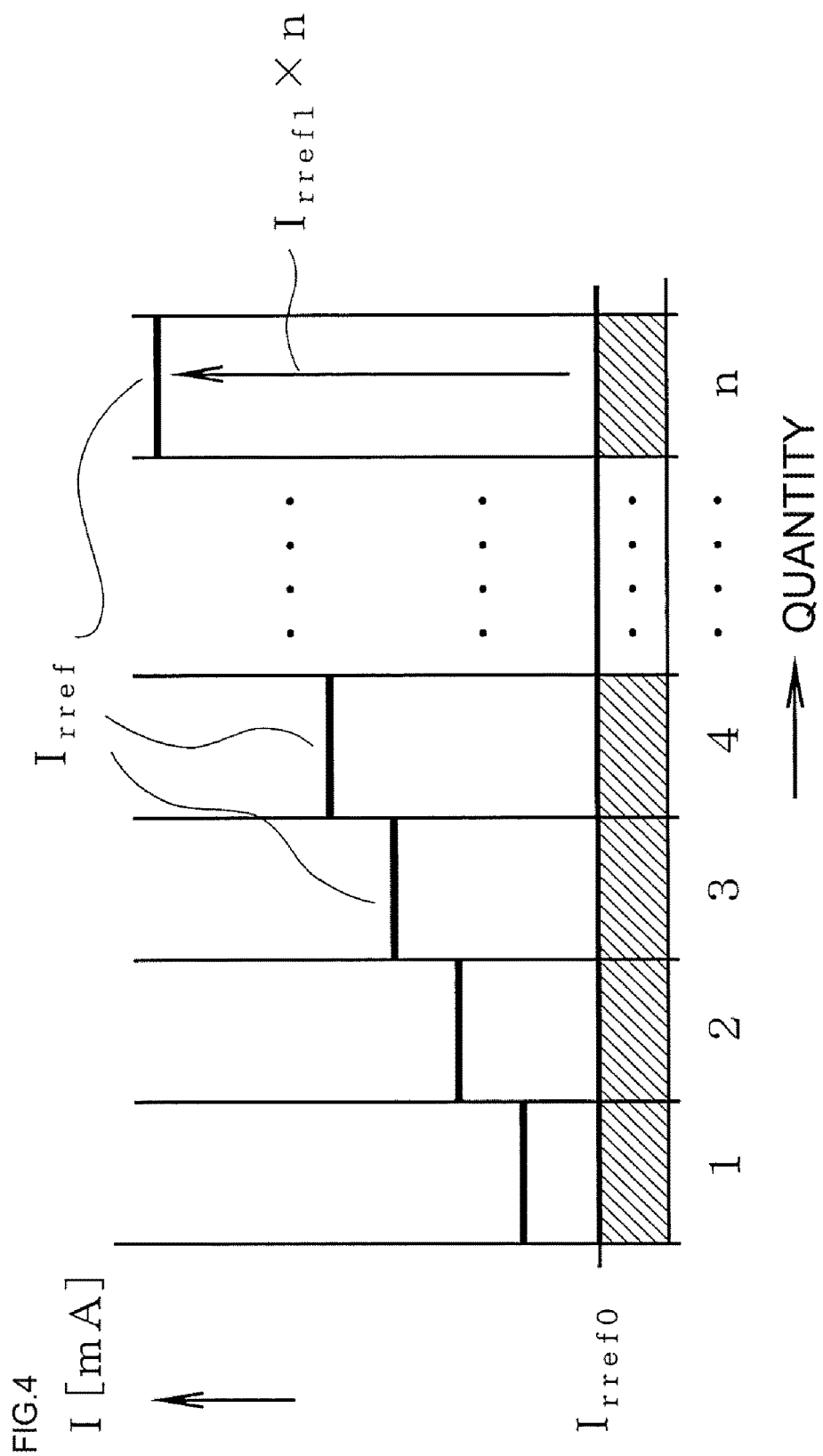
FIG. 4 is an illustration of a monitoring setting value $I_{rref}$ in the second embodiment.

The quantity of load apparatus operated output from the operated quantity acquisition unit 42i and the unit setting value $I_{rref1}$ are input into the monitoring setting value computing unit 42h. Also, a base setting value $I_{rref0}$ which forms a base, is held in the monitoring setting value computing unit 42h, as shown in FIG. 4. The base setting value $I_{rref0}$ corresponds to a resistance component monitoring current setting value that forms a reference for monitoring the insulation of a power system and apparatus (for example, the upper monitoring limit of 50 [mA] stipulated by the private electrical facilities safety management regulations).

The monitoring setting value $I_{rref}$ is computed in the monitoring setting value computing unit 42h by the base setting value $I_{rref0}$ being added to the product of the load apparatus operated quantity n and unit setting value $I_{rref1}$, as shown in Expression 1, and output to the insulation evaluation unit 42d.

$$Irref = Irref1 \times n + IrrefO \quad \text{(Expression 1)}$$

A comparison with the resistance component current $I_{gr}$ is carried out in the insulation evaluation unit 42d using the monitoring setting value $I_{rref}$ changed as shown in FIG. 4 in accordance with the load apparatus operated quantity, thereby carrying out insulation monitoring.

According to the second embodiment, it is possible to use the appropriate monitoring setting value $I_{rref}$ in accordance with the load apparatus operated quantity, because of which it is possible to carry out accurate insulation monitoring even in a system wherein the load apparatus operated quantity varies frequently.

Figure 5:
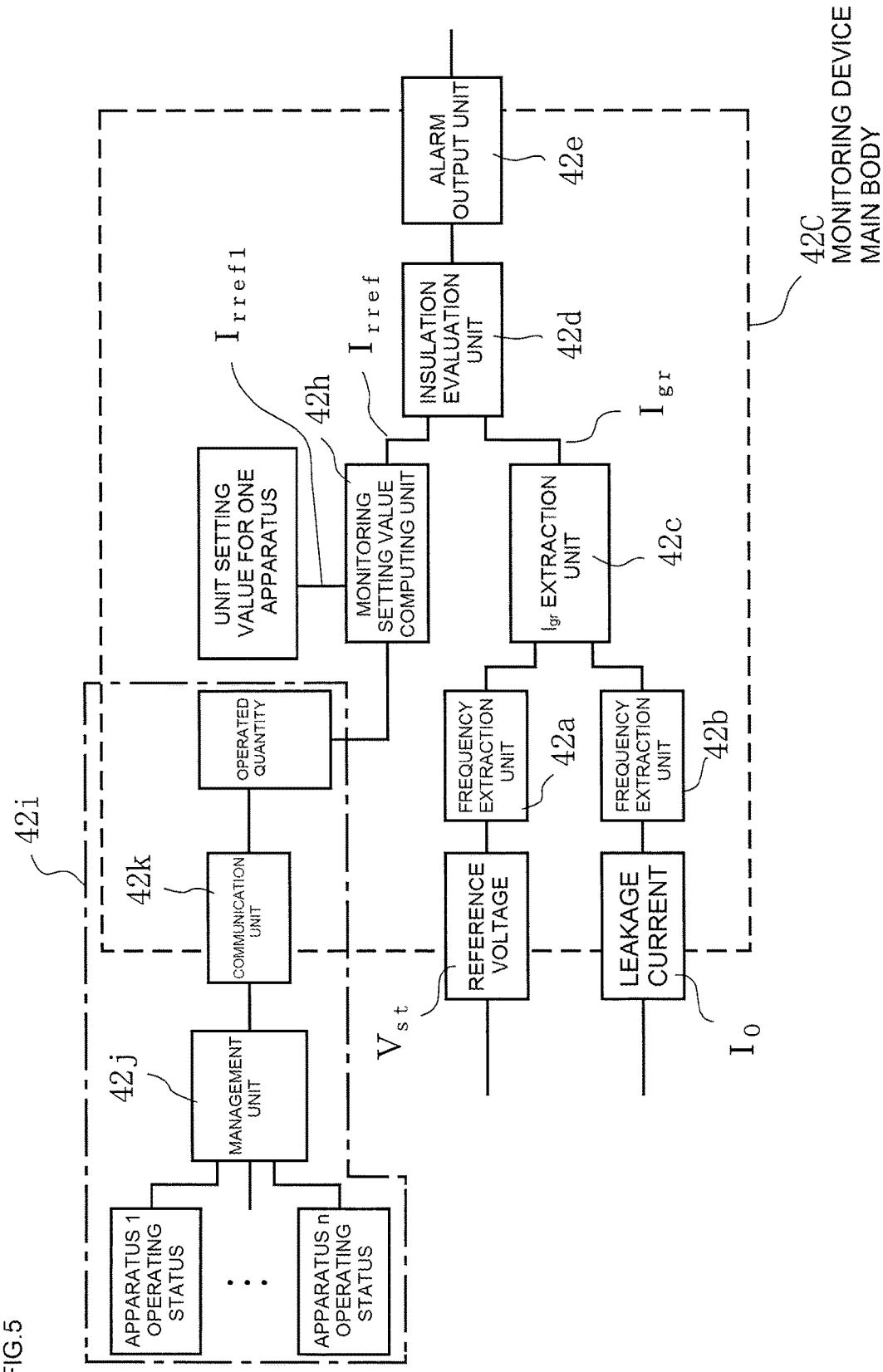
FIG. 5 is a block diagram showing the configuration of a monitoring device main body according to a third embodiment of the invention.

FIG. 5 is a block diagram showing the configuration of a monitoring device main body according to a third embodiment of the invention. A monitoring device main body 42C of FIG. 5 is such that the operated quantity acquisition unit 42i constantly manages the operating status of n load apparatus using a management unit 42j such as a server or PLC (Programmable Logic Controller), and acquires the load apparatus operated quantity via a communication unit 42k. By the operated quantity and the unit setting value $I_{rref1}$ for one load apparatus being input into the monitoring setting value computing unit 42h, Expression 1 is computed in the same way as in the second embodiment, and insulation monitoring is carried out by a comparison of the monitoring setting value $I_{rref}$ changed in accordance with the load apparatus operated quantity and the resistance component current $I_{gr}$.

Communication means between the management unit 42j and communication unit 42k, and communication means between the load apparatus 1 to n and management unit 42j, may be either wired or wireless.

According to the third embodiment, accurate insulation monitoring is possible even in a system wherein the load apparatus operated quantity varies frequently, in the same way as in the second embodiment, and by the load apparatus operating status being acquired by wireless communication, it is possible to omit wiring between the load apparatus and monitoring device main body 42C.

Figure 6:
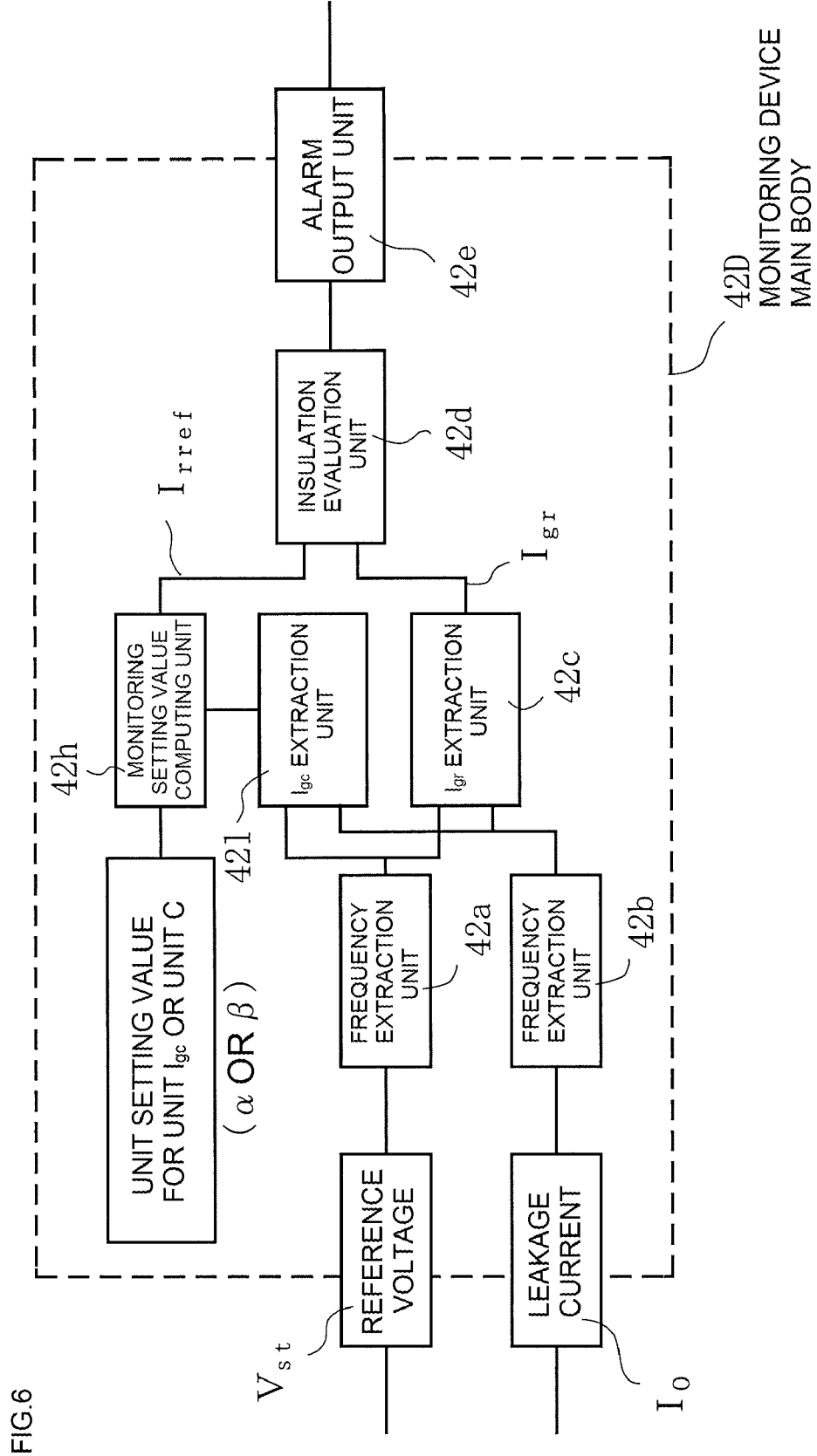
FIG. 6 is a block diagram showing the configuration of a monitoring device main body according to a fourth embodiment of the invention.

FIG. 6 is a block diagram showing the configuration of a monitoring device main body according to a fourth embodiment of the invention.

A monitoring device main body 42D of FIG. 6 includes an $I_{gc}$ extraction unit 42l as well as the $I_{gr}$ extraction unit 42c. The $I_{gc}$ extraction unit 42l extracts a capacitance component current $I_{gc}$, which is a frequency component that is the same as the supervisory signal included in the leakage current $I_O$, and whose phase leads by 90 degrees with respect to the reference voltage $V_{st}$.

Figure 7:
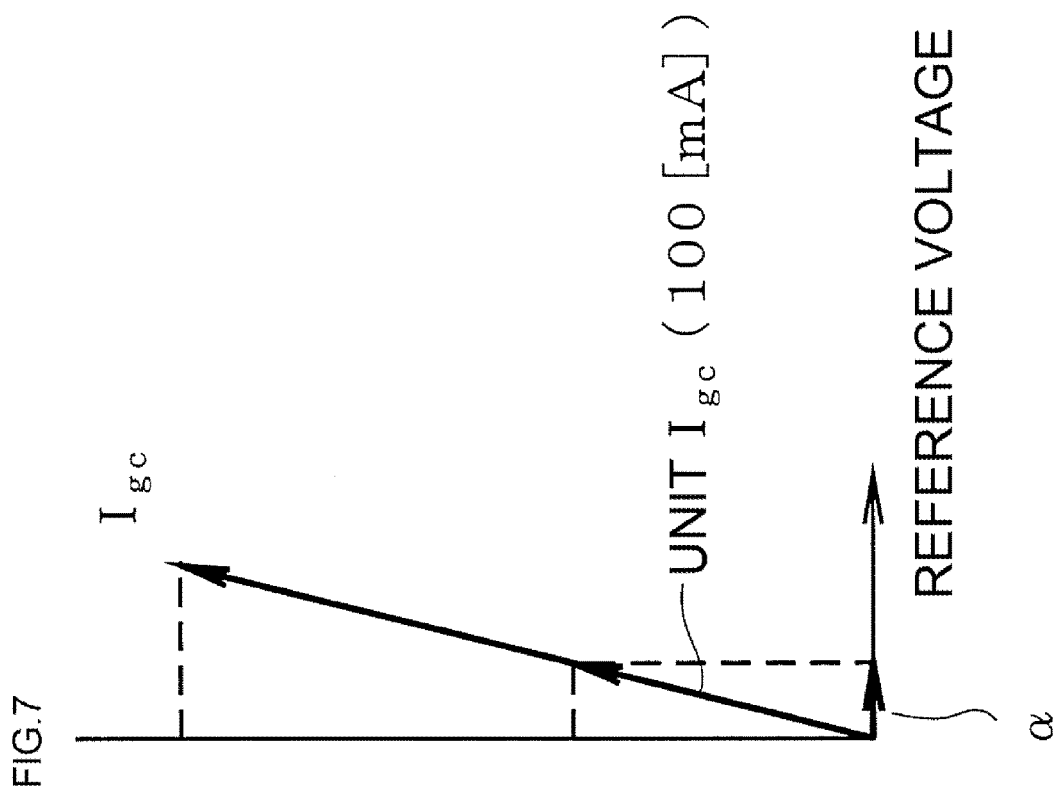
FIG. 7 is an illustration of a unit error current for a unit capacitance component current $I_{gc}$ in the fourth embodiment.

Furthermore, a monitoring setting value (unit setting value) α for each unit capacitance component current, or a monitoring setting value (unit setting value) β for each unit electrical capacitance converted from the capacitance component current, is stored in the monitoring device main body 42D. FIG. 7 is an illustration of the unit setting value α for each unit capacitance component current, wherein the unit setting value α corresponds to, for example, the resistance component error current for each unit capacitance component current 100 [mA].

Figure 8:
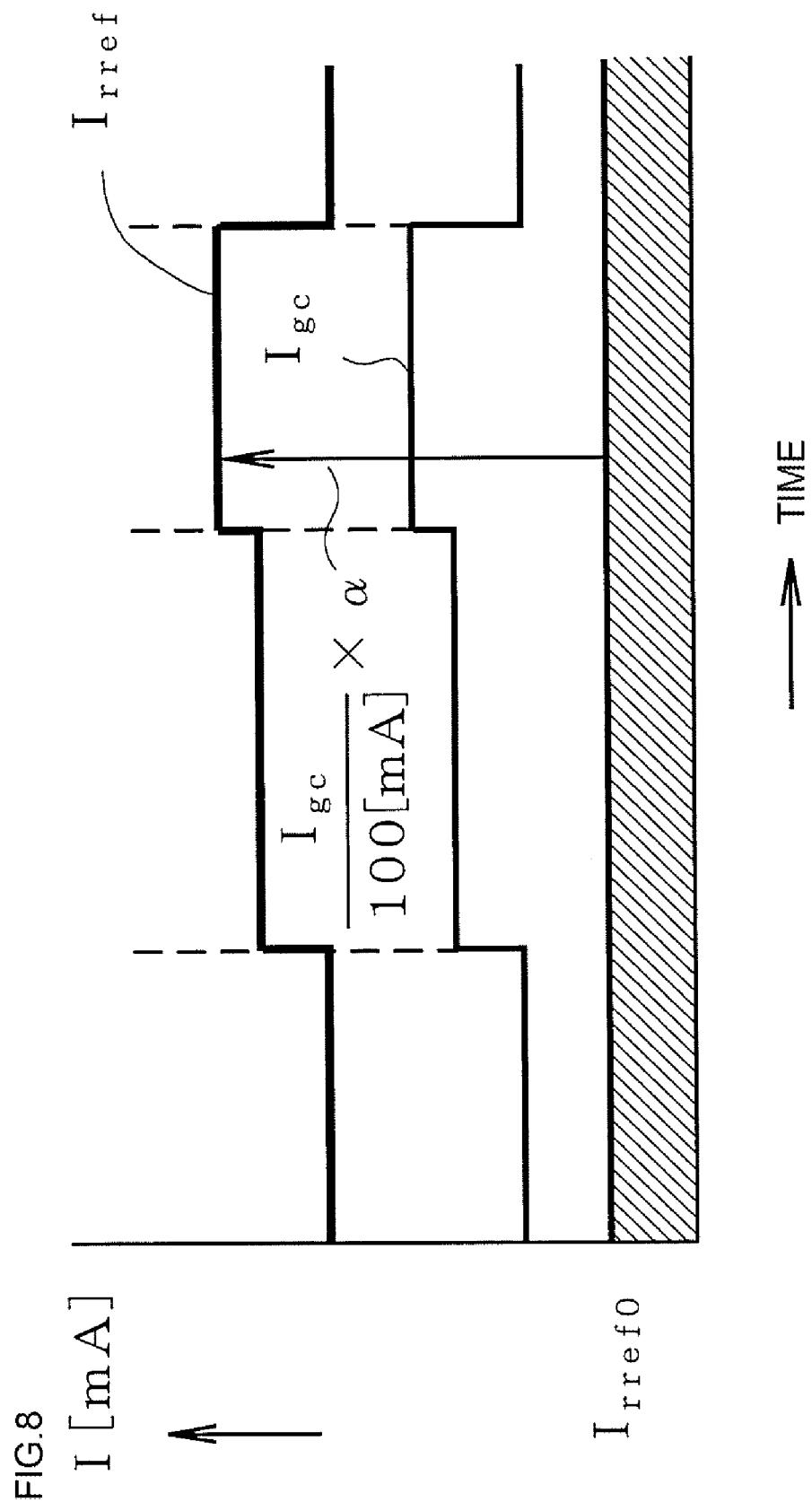
FIG. 8 is an illustration of the monitoring setting value $I_{rref}$ in the fourth embodiment.

The monitoring setting value computing unit 42h carries out the computation of Expression 2, thus calculating the monitoring setting value $I_{rref}$ based on the $I_{gc}$ output from the $I_{gc}$ extraction unit 42l and the unit setting value α. $I_{rref0}$ is the base setting value, in the same way as previously described. FIG. 8 is an illustration of the monitoring setting value $I_{rref}$ computed using Expression 2.

$$I_{rref}=(I_{gc}/100[mA])\times\alpha+I_{rref0} \qquad \text{(Expression 2)}$$

Also, when the unit electrical capacitance is, for example, 1 [μF], the monitoring setting value $I_{rref}$ is computed using Expression 3. In Expression 3, C is an electrical capacitance value converted from the capacitance component current $I_{gc}$.

$$I_{rref}=(C/1[\mu F])\times\alpha+I_{rref0} \qquad \text{[Expression 3]}$$

Insulation monitoring is carried out by the monitoring setting value $I_{rref}$ computed in this way being input into the insulation evaluation unit 42d, and compared with the resistance component current $I_{gr}$ output from the $I_{gr}$ extraction unit 42c.

According to the fourth embodiment, insulation monitoring is carried out using a monitoring setting value $I_{rref}$ of a size in accordance with the capacitance component current $I_{gc}$ extracted from the leakage current $I_O$ or the electrical capacitance value C.

Because of this, compared with when determining the monitoring setting value $I_{rref}$ by estimating the resistance component error current $I_{gr}'$ from the load apparatus operating schedule or operated quantity, as in the first to third embodiments, it is possible to obtain a monitoring setting value $I_{rref}$ that reflects the capacitance component current $I_{gc}$ actually flowing in the system, and possible to carry out more accurate insulation monitoring by using the monitoring setting value $I_{rref}$.

Figure 9:
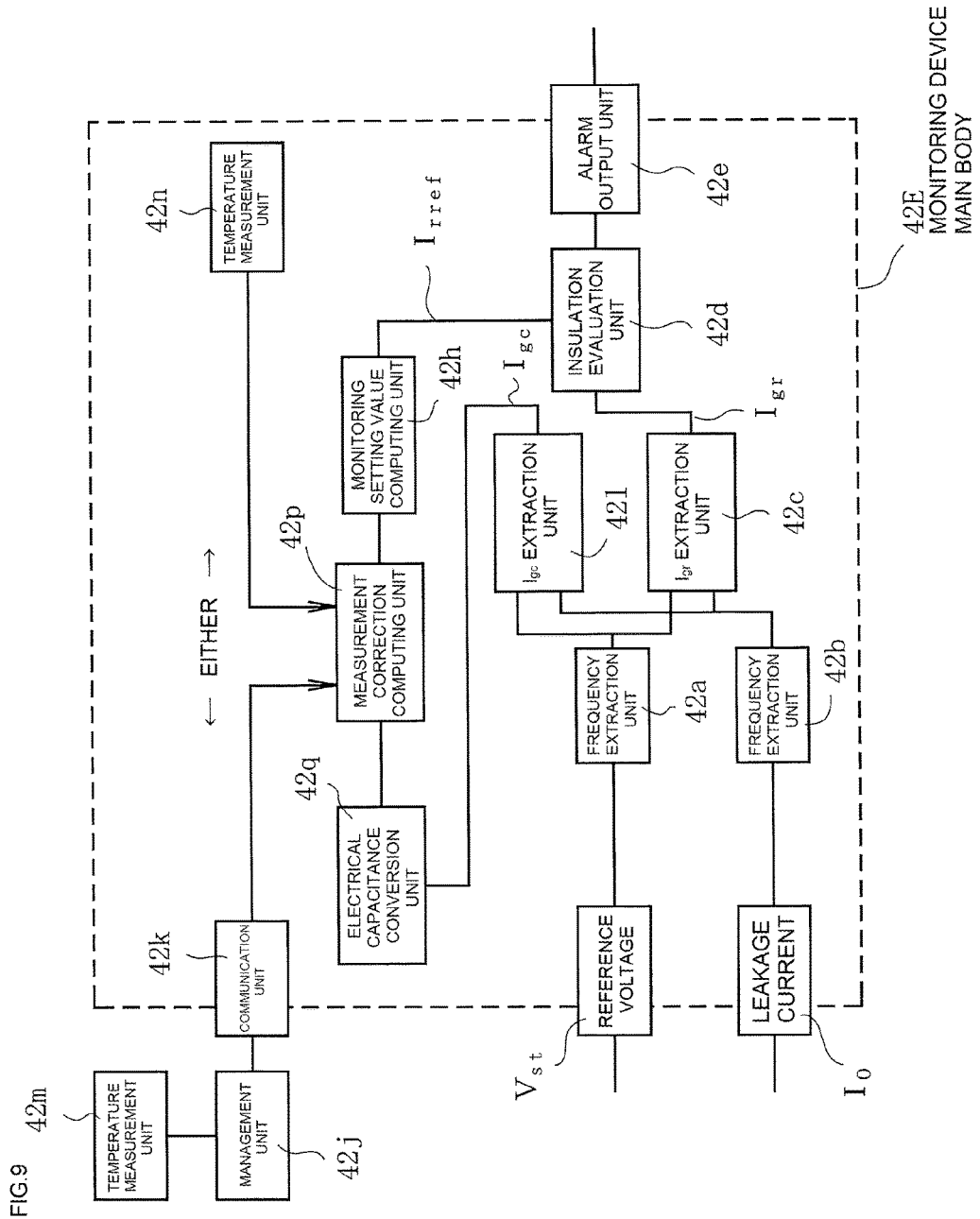
FIG. 9 is a block diagram showing the configuration of a monitoring device main body according to a fifth embodiment of the invention.

Next, FIG. 9 is a block diagram showing the configuration of a monitoring device main body according to a fifth embodiment of the invention.

A monitoring device main body 42E of FIG. 9 is such that the extracted capacitance component current $I_{gc}$ is converted into electrical capacitance C, and the electrical capacitance C is temperature-corrected and used in the computation of the monitoring setting value $I_{rref}$.

That is, the monitoring device main body 42E of FIG. 9 is such that the capacitance component current $I_{gc}$ extracted by the $I_{gc}$ extraction unit 42c is input into an electrical capacitance conversion unit 42q, and converted into electrical capacitance. The electrical capacitance C is temperature-corrected by a temperature correction computing unit 42p, and input into the monitoring setting value computing unit 42h.

A temperature measurement value from a temperature measurement unit 42n inside the monitoring device main body 42E, or a temperature measurement value measured by a temperature measurement unit 42m outside the monitoring device main body 42E and received via the management unit 42j and communication unit 42k, is input into the temperature correction computing unit 42p.

Figure 10:
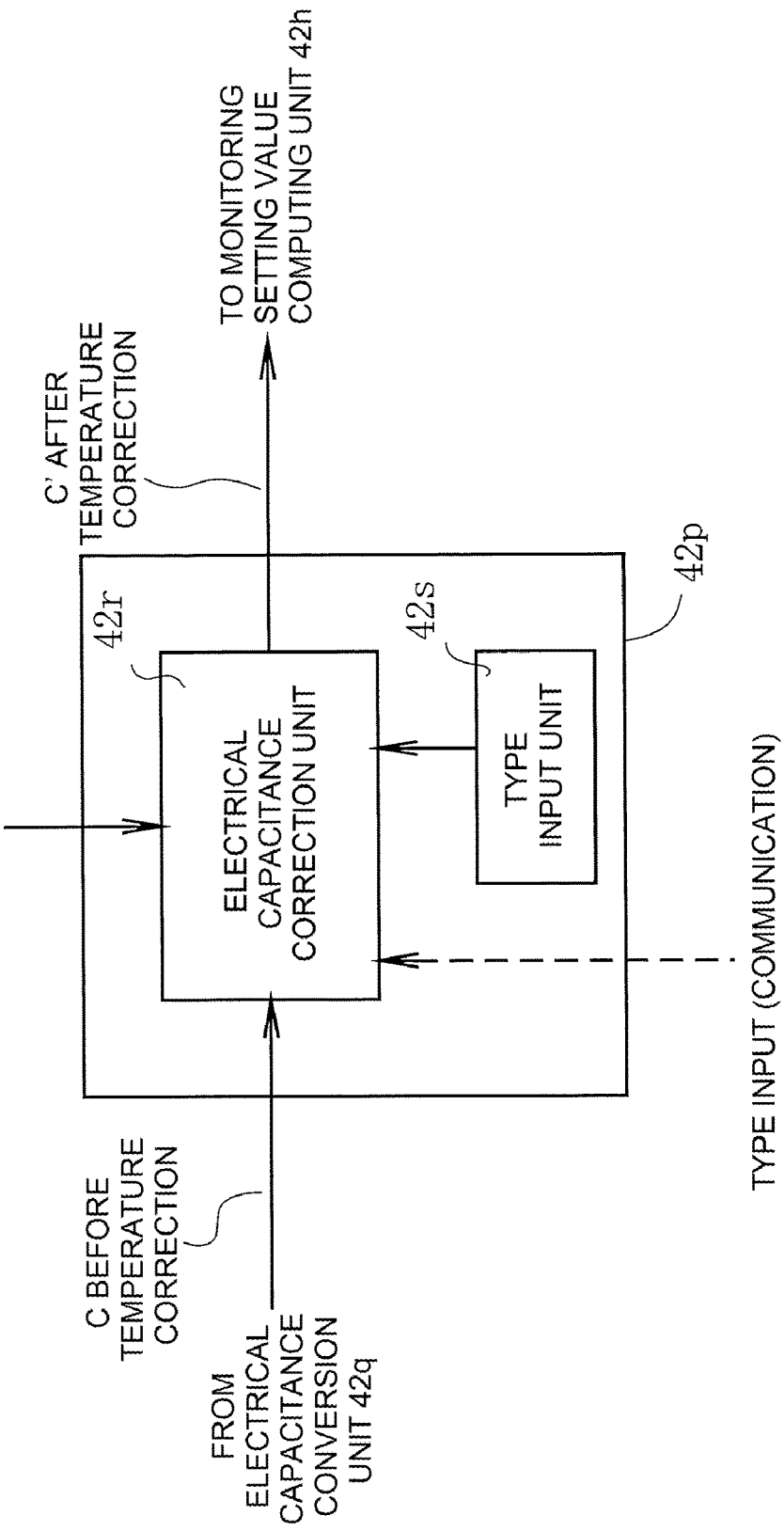
FIG. 10 is a block diagram showing the configuration of a temperature correction computing unit in FIG. 9.

FIG. 10 is a block diagram showing the configuration of the temperature correction computing unit 42p of FIG. 9.

In FIG. 10, an electrical capacitance correction unit 42r corrects the electrical capacitance C before temperature correction input from the electrical capacitance conversion unit 42q to C' using the temperature measurement value and an electrical capacitance rate of change, to be described hereafter, and outputs the electrical capacitance C' to the monitoring setting value computing unit 42h.

Also, a type input unit 42s is for inputting the type of capacitor (dielectric body type, maker, model, and the like) configuring the noise filter 31 into the electrical capacitance correction unit 42r via a manual operation by an operator. Instead of the type input unit 42s, the capacitor type may be input into the electrical capacitance correction unit 42r by communication from the exterior via the communication unit 42k of FIG. 9.

Figure 11:
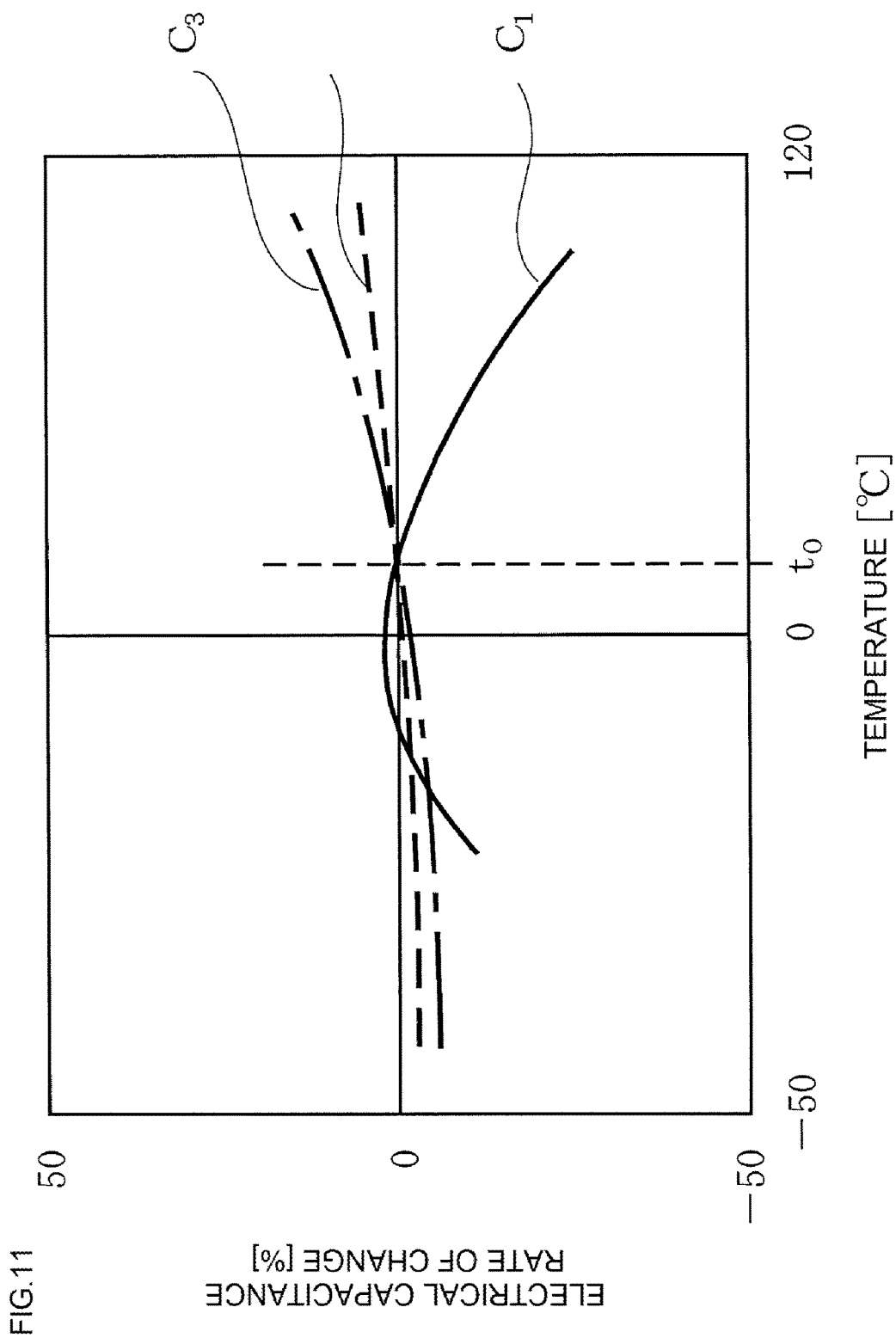
FIG. 11 is a diagram showing temperature characteristics of a capacitor.

Generally, the electrical capacitance of a capacitor changes in accordance with ambient temperature, and the rate of change differs in accordance with the type of capacitor. FIG. 11 shows the relationship between capacitor ambient temperature and electrical capacitance rate of change (temperature characteristics), wherein $C_1$, $C_2$, and $C_3$ are the characteristics of differing types of capacitor. The electrical capacitance rate of change is 0[%] at a reference temperature $t_0$.

Because of this, the electrical capacitance correction unit 42r selects temperature characteristics in accordance with the type of capacitor from among, for example, $C_1$, $C_2$, and $C_3$ of FIG. 11, and can obtain the electrical capacitance C' after temperature correction by multiplying the electrical capacitance rate of change corresponding to the temperature measurement value for the selected characteristics by the electrical capacitance C.

FIG. 12 shows the kinds of capacitor temperature characteristics shown in FIG. 11 as a table. By incorporating the table in the electrical capacitance correction unit 42r, and using an electrical capacitance rate of change in accordance with the temperature measurement value, it is possible to swiftly compute the electrical capacitance C' after temperature correction.

Provided that the electrical capacitance C' of the capacitor at the current temperature measurement value can be calculated in this way, the monitoring setting value computing unit 42h can calculate the monitoring setting value $I_{rref}$ by adding the resistance component error current corresponding to the electrical capacitance C' and the base setting value. It is sufficient that the insulation evaluation unit 42d carries out insulation monitoring using the monitoring setting value $I_{rref}$ calculated in this way.

Embodiments of the invention can be utilized not only in an $I_{gr}$ type, but also in an $I_{or}$ type of insulation monitoring device that uses the voltage to ground of a system.

REFERENCE SIGNS AND NUMERALS ARE AS FOLLOWS 42A, 42B, 42C, 42D, 42E: Monitoring device main body
42a, 42b: Frequency extraction unit
42c: $I_{gr}$ extraction unit
42d: Insulation evaluation unit
42e: Alarm output unit
42f: Clock
42g: Schedule setting table
42h: Monitoring setting value computing unit
42i: Operated quantity acquisition unit
42j: Management unit
42k: Communication unit
42l: $I_{gc}$ extraction unit
42m, 42n: Temperature measurement unit
42p: Temperature correction computing unit
42q: Electrical capacitance conversion unit
42r: Electrical capacitance correction unit
42s: Type input unit

What is claimed is:

1. An insulation monitoring device that detects leakage current flowing back via a ground insulation resistor of a power system or load apparatus connected to the power system, calculates from the leakage current a resistance component current of a same phase as a reference voltage superimposed on the power system, and detects an insulation failure caused by a decrease in a ground insulation resistance when the resistance component current exceeds a monitoring setting value, the insulation monitoring device configured to monitor the power system to which a noise filter including a capacitor is connected when the load apparatus operates, the insulation monitoring device comprising:

a table in which the monitoring setting value greater than a resistance component error current flowing in accordance with a sum of an electrical capacitance of the capacitor and a ground insulation capacitance of the power system is set in advance in accordance with an operating schedule of the load apparatus; and a monitoring setting value computing unit that outputs the monitoring setting value read from the table in accordance with the operating schedule at the current time, wherein the insulation monitoring device is configured to use the monitoring setting value output from the monitoring setting value computing unit in a comparison with the resistance component current to detect insulation failure.

2. An insulation monitoring device that detects leakage current flowing back via a ground insulation resistor of a power system or load apparatus connected to the power system, calculates from the leakage current a resistance component current of a same phase as a reference voltage superimposed on the power system, and detects an insulation failure caused by a decrease in a ground insulation resistance when the resistance component current exceeds a monitoring setting value, the insulation monitoring device configured to monitor the power system to which a noise filter including a capacitor is connected when the load apparatus operates, the insulation monitoring device comprising:

an operated quantity acquisition unit that acquires an operated quantity of the load apparatus; and a monitoring setting value computing unit that computes the monitoring setting value using a unit setting value of one load apparatus, the operated quantity, and a base setting value in accordance with a resistance component error current flowing in accordance with a ground insulation capacitance of the power system, wherein the insulation monitoring device is configured to use the monitoring setting value computed by the monitoring setting value computing unit in a comparison with the resistance component current to detect insulation failure.

3. An insulation monitoring device that detects leakage current flowing back via a ground insulation resistor of a power system or load apparatus connected to the power system, calculates from the leakage current a resistance component current of a same phase as a reference voltage of the power system, and detects an insulation failure caused by a decrease in a ground insulation resistance when the resistance component current exceeds a monitoring setting value, the insulation monitoring device configured to monitor the power system to which a noise filter including a capacitor is connected when the load apparatus operates, the insulation monitoring device comprising:

a capacitance component current extraction unit that extracts a capacitance component current whose phase is further advanced than that of the resistance component current from a current with the same frequency component as a supervisory signal; and a monitoring setting value computing unit that computes the monitoring setting value using the capacitance component current extracted by the capacitance component current extraction unit, a unit setting value of a unit capacitance component current or unit electrical capacitance, and a base setting value in accordance with a resistance component error current flowing in accordance with a ground insulation capacitance of the power system, wherein the insulation monitoring device is configured to use the monitoring setting value computed by the monitoring setting value computing unit in a comparison with the resistance component current to detect insulation failure.

4. An insulation monitoring device that detects leakage current flowing back via a ground insulation resistor of a power system or load apparatus connected to the power system, calculates from the leakage current a resistance component current of a same phase as a reference voltage of the power system, and detects an insulation failure caused by a decrease in a ground insulation resistance when the resistance component current exceeds a monitoring setting value, the insulation monitoring device configured to monitor the power system to which a noise filter including a capacitor is connected when the load apparatus operates, the insulation monitoring device comprising:
- a capacitance component current extraction unit that extracts a capacitance component current whose phase is further advanced than that of the resistance component current from a current with a same frequency component as a supervisory signal;
- an electrical capacitance conversion unit that converts the capacitance component current extracted by the capacitance component current extraction unit into electrical capacitance;
- a temperature correction computing unit that corrects the electrical capacitance converted by the electrical capacitance conversion unit using an electrical capacitance rate of change in accordance with a type of the capacitor and an ambient temperature measurement value; and
- a monitoring setting value computing unit that computes the monitoring setting value using a resistance component error current that flows in accordance with the electrical capacitance corrected by the temperature correction computing unit and a base setting value in accordance with a resistance component error current flowing in accordance with a ground insulation capacitance of the power system, wherein
the insulation monitoring device is configured to use the monitoring setting value computed by the monitoring setting value computing unit in a comparison with the resistance component current to detect insulation failure.

5. An insulation monitoring device that detects leakage current flowing back via a ground insulation resistor of a power system or load apparatus connected to the power system, calculates from the leakage current a resistance component current of a same phase as a reference voltage of or superimposed on the power system, and detects an insulation failure caused by a decrease in a ground insulation resistance when the resistance component current exceeds a monitoring setting value, the insulation monitoring device configured to monitor the power system to which a noise filter including a capacitor is connected when the load apparatus operates, the insulation monitoring device comprising:
- at least one unit configured to obtain an adjusted monitoring setting value by increasing the monitoring setting value to be greater than a resistance component error current flowing in accordance with a sum of an electrical capacitance of the capacitor and a ground insulation capacitance of the power system, wherein
the insulation monitoring device is configured to use the adjusted monitoring setting value in a comparison with the resistance component current to detect insulation failure.

* * * * *